(12) United States Patent
Standing et al.

(10) Patent No.: US 7,285,866 B2
(45) Date of Patent: Oct. 23, 2007

(54) SURFACE MOUNTED PACKAGE WITH DIE BOTTOM SPACED FROM SUPPORT BOARD

(75) Inventors: Martin Standing, Tonbrige (GB); Andrew N Sawle, East Grinstead (GB)

(73) Assignee: International Rectifier Corporation, El Segundo, CA (US)

( * ) Notice: Subject to any disclaimer, the term of this patent is extended or adjusted under 35 U.S.C. 154(b) by 214 days.

(21) Appl. No.: 11/146,628

(22) Filed: Jun. 7, 2005

(65) Prior Publication Data

US 2005/0224960 A1    Oct. 13, 2005

Related U.S. Application Data

(63) Continuation of application No. 10/327,270, filed on Dec. 20, 2002, now Pat. No. 6,930,397, which is a continuation-in-part of application No. 09/819,774, filed on Mar. 28, 2001, now Pat. No. 6,624,522.

(60) Provisional application No. 60/342,333, filed on Dec. 21, 2001.

(51) Int. Cl.
    *H01L 29/41* (2006.01)
(52) U.S. Cl. .................................. 257/782
(58) Field of Classification Search ............... 257/741, 257/762, 768, 772, 781, 782, 784
    See application file for complete search history.

(56) References Cited

U.S. PATENT DOCUMENTS

| | | |
|---|---|---|
| 3,561,107 A | 2/1971 | Best et al. |
| 3,871,014 A | 3/1975 | King et al. |
| 3,972,062 A | 7/1976 | Hopp |
| 4,021,838 A | 5/1977 | Warwick |
| 4,604,644 A | 8/1986 | Beckham et al. |
| 5,047,833 A | 9/1991 | Gould |
| 5,217,922 A | 6/1993 | Akasaki et al. |
| 5,311,402 A | 5/1994 | Kobayashi et al. |
| 5,313,366 A | 5/1994 | Gaudenzi et al. |
| 5,367,435 A | 11/1994 | Andros et al. |
| 5,371,404 A | 12/1994 | Juskey et al. |
| 5,381,039 A | 1/1995 | Morrison |
| 5,394,490 A | 2/1995 | Kato et al. |

(Continued)

FOREIGN PATENT DOCUMENTS

JP    5-129516    5/1993

OTHER PUBLICATIONS

MOSFET BGA Design Guide 2004-Fairchild Semiconductor.

*Primary Examiner*—Thomas Dickey
(74) *Attorney, Agent, or Firm*—Ostrolenk, Faber, Gerb & Soffen, LLP

(57) ABSTRACT

A semiconductor package according to the present invention includes a metal can which receives in its interior space a MOSFET. The MOSFET so received is oriented such that its drain electrode is facing the bottom of the can and is electrically connected to the same by a layer of conductive epoxy or a solder or the like. The edges of the MOSFET so placed are spaced from the walls of the can. The space between the edges of the MOSFET and the walls of the can is filled with an insulating layer. A surface of the MOSFET is sub-flush below the plane of a substrate by 0.001-0.005 inches to reduce temperature cycling failures.

25 Claims, 2 Drawing Sheets

U.S. PATENT DOCUMENTS

| | | |
|---|---|---|
| 5,397,921 A | 3/1995 | Karnezos |
| 5,447,886 A | 9/1995 | Rai |
| 5,448,114 A | 9/1995 | Kondoh et al. |
| 5,454,160 A | 10/1995 | Nickel |
| 5,477,087 A | 12/1995 | Kawakita et al. |
| 5,510,758 A | 4/1996 | Fujita et al. |
| 5,512,786 A | 4/1996 | Imamura et al. |
| 5,532,512 A | 7/1996 | Fillion et al. |
| 5,554,887 A | 9/1996 | Sawai et al. |
| 5,578,869 A | 11/1996 | Hoffman et al. |
| 5,654,590 A | 8/1997 | Kuramochi |
| 5,703,405 A | 12/1997 | Zeber |
| 5,726,489 A | 3/1998 | Matsuda et al. |
| 5,726,501 A | 3/1998 | Matsubara |
| 5,726,502 A | 3/1998 | Beddingfield |
| 5,729,440 A | 3/1998 | Jimarez et al. |
| 5,734,201 A | 3/1998 | Djennas et al. |
| 5,739,585 A | 4/1998 | Akram et al. |
| 5,814,884 A | 9/1998 | Davis et al. |
| 5,814,894 A | 9/1998 | Igarashi et al. |
| 5,904,499 A * | 5/1999 | Pace .......................... 438/108 |
| 6,133,634 A | 10/2000 | Joshi |
| 6,391,687 B1 | 5/2002 | Cabahug et al. |
| 6,396,127 B1 | 5/2002 | Munoz et al. |
| 6,469,398 B1 | 10/2002 | Hori |
| 6,624,522 B2 * | 9/2003 | Standing et al. ............ 257/782 |
| 6,744,124 B1 | 6/2004 | Chang et al. |
| 6,777,786 B2 | 8/2004 | Estacio |
| 6,784,540 B2 * | 8/2004 | Cardwell .................... 257/722 |
| 6,841,865 B2 * | 1/2005 | Standing .................... 257/696 |
| 6,930,397 B2 * | 8/2005 | Standing et al. ............ 257/782 |
| 7,122,887 B2 * | 10/2006 | Standing et al. ............ 257/690 |
| 2004/0217474 A1 * | 11/2004 | Kajiwara et al. ........... 257/734 |

\* cited by examiner

SURFACE MOUNTED PACKAGE WITH DIE BOTTOM SPACED FROM SUPPORT BOARD

CROSS-REFERENCE TO RELATED APPLICATION

This application is a continuation of U.S. patent application Ser. No. 10/327,270, filed Dec. 20, 2002, entitled SURFACE MOUNTED PACKAGE WITH DIE BOTTOM SPACED FROM SUPPORT BOARD which is based on and claims priority to U.S. Provisional Application No. 60/342,333, filed on Dec. 21, 2001, by Martin Standing and Andrew N. Sawle, entitled "SURFACE MOUNTED PACKAGE WITH DIE BOTTOM SPACED FROM SUPPORT BOARD," and is a continuation-in-part application of U.S. Pat. No. 6,624,522, issued on Sep. 23, 2003, by Martin Standing and Hazel Deborah Schofield, entitled "CHIP SCALE SURFACE MOUNTED DEVICE AND PROCESS OF MANUFACTURE," the subject matter and disclosure of both applications being incorporated by reference herein.

FIELD OF THE INVENTION

The present invention relates to a semiconductor package and more particularly to a semiconductor package for housing a power semiconductor die having a structure which reduces temperature cycling failures.

BACKGROUND OF THE INVENTION

Generally, thermal cycling causes frequent and repeated stress which in layered structures leads to cracks due to, for example, fatigue. Temperature cycling, therefore, is a material factor in causing failure in layered structures.

In semiconductor device packages, temperature cycling causes failures in die-underfill bonding, underfill-substrate bonding, solder bump attachment and passivation layers among other areas. This reduces the reliability of the package. It is, therefore, desirable to provide a means to reduce failure caused by temperature cycling.

Referring now to the drawings, in which like reference numerals refer to like elements, there is shown in FIGS. 1 and 2 a semiconductor package 5 that is fully described in U.S. patent application Ser. No. 09/819,774, filed Mar. 28, 2001 which is assigned to the assignee of the present application and incorporated herein by reference. FIGS. 1 and 2 show that semiconductor package 5 includes MOSFET 10 inside cup-shaped can 12 which functions as a drain clip. Can 12 is preferably made from a copper alloy and is silver-plated. Can 12 has internal dimensions that are greater than those of MOSFET 10; thus MOSFET 10 is readily received in the interior of can 12. The drain contact of MOSFET 10 is connected to the bottom of can 12 by a layer of silver-loaded conductive epoxy 14. A ring of low stress high adhesion epoxy 16 is applied around the edges of MOSFET 10 to seal and add extra structural strength to the package. Source contact 18 and gate contact 20 of MOSFET 10, which are disposed on a surface of MOSFET 10 opposing its drain contact, are exposed as shown in FIG. 1. Can 12 includes two rows of projections 22 disposed on two of its opposing edges. Projections are provided to make electrical contact with respective lands on a circuit board (not shown), such as an Insulated Metal Substrate or an ordinary circuit board, thereby electrically connecting the drain of MOSFET 10 to its place within a circuit. As shown in FIG. 1, source contact 18 of MOSFET 10 is flush with the contact surfaces of projections 22 of can 12. Therefore, source contact 18 and gate contact 20 of MOSFET 10 will be flush with the surface of the circuit board when package 5 is mounted thereon.

The above-described package is subject to possible failure due to temperature cycling, as described above. It is desirable, therefore, to produce a package design having a similar structure as described above, such that substrate failure caused by thermal cycling is reduced.

SUMMARY OF THE INVENTION

In order to reduce substrate failure, for example, caused by thermal cycling a semiconductor device package is disclosed that comprises a semiconductor device die having a first surface substantially parallel to a second surface, and the first surface and second surface each have a solderable planar metal electrode. Further, a metal clip is disclosed that has a flat web portion comprising a first and second surface, wherein the second surface is electrically connected with the first surface of the semiconductor device die.

From the edge of flat web portion of the clip, at least one solderable planar metal post-shaped electrode extends over and spaced from an edge of the semiconductor device die. The die is disposed in the interior of the clip such that the die is inwardly recessed in the interior of the clip and the second surface of the die is not flush (or co-planar) with the at least one solderable planar metal post-shaped electrode. The interior of the solderable planar metal post-shaped electrode is removed to a parallel plane above the plane of the second surface of the die.

The at least one solderable planar metal post-shaped electrode is mountable to a metallized pattern on a support surface, such as a circuit board and the second surface of the die is spaced from the metallized pattern on the support surface.

Therefore, the semiconductor package according to the present invention reduces the number of failures due to thermal cycling and, thus, adds to the reliability of the package. Furthermore, the semiconductor package according to the present invention includes a vertical conduction MOS-gated die such as a MOSFET having a first major surface on which a major electrode and a control electrode are disposed and another major surface opposing the first major surface on which another major electrode is disposed. Conventionally, the first major electrode in a vertical conduction MOSFET used in a package according to the present invention is the source electrode; while, its second major electrode is the drain electrode. The control electrode in a vertical conduction MOSFET is conventionally referred to as the gate electrode.

While the die is described herein as a power MOSFET, it will be apparent that the die may be any desired die, including any MOS-gated device (e.g., an IGBT), a thyristor or diode, or the like.

DETAILED DESCRIPTION OF THE PREFERRED EMBODIMENT

Figure 1:
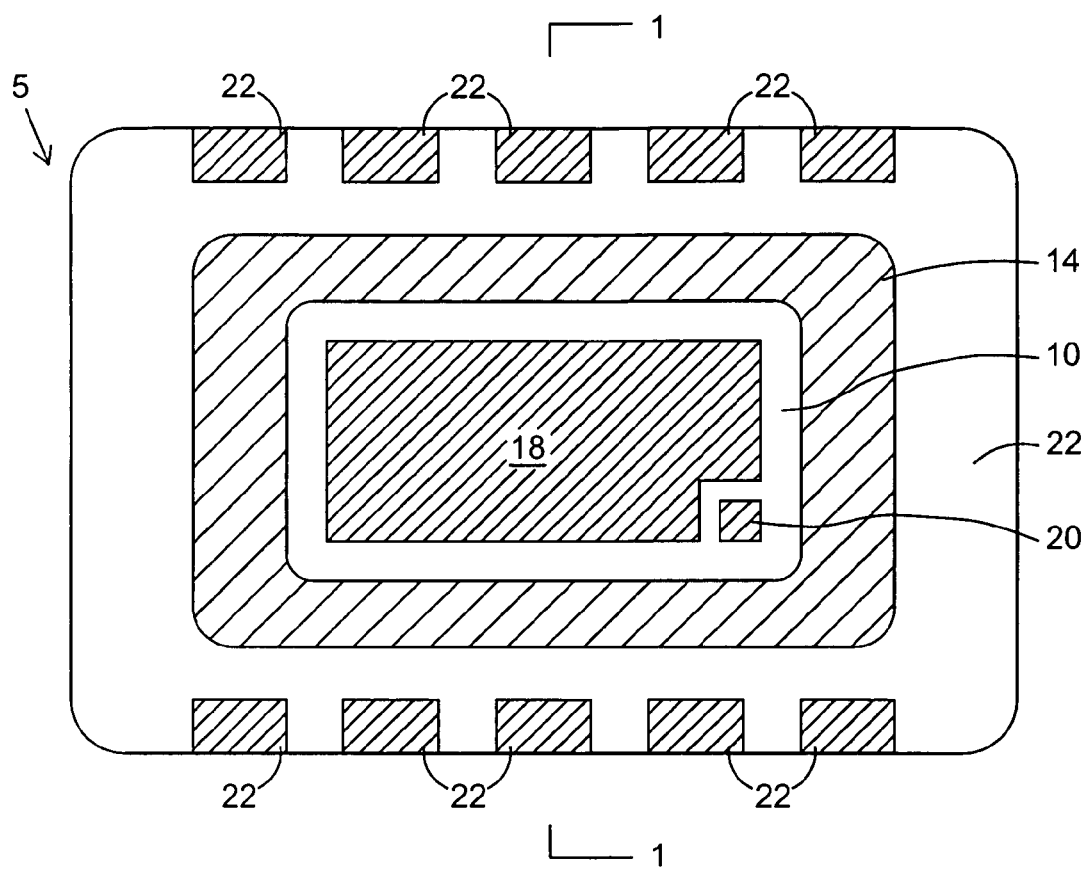
FIG. 1 shows a top view of a semiconductor package according to the prior art.
Figure 2:
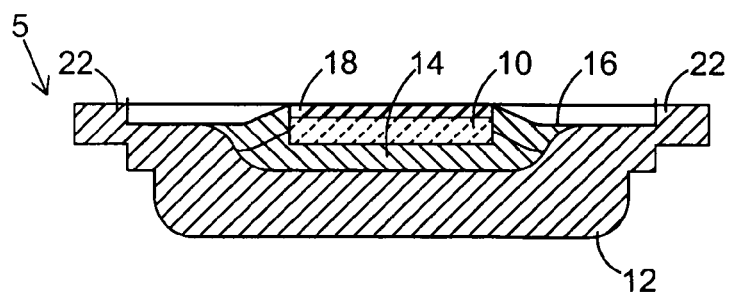
FIG. 2 shows a cross-section of semiconductor package of FIG. 1 looking in the direction of line 1-1.
Figure 3:
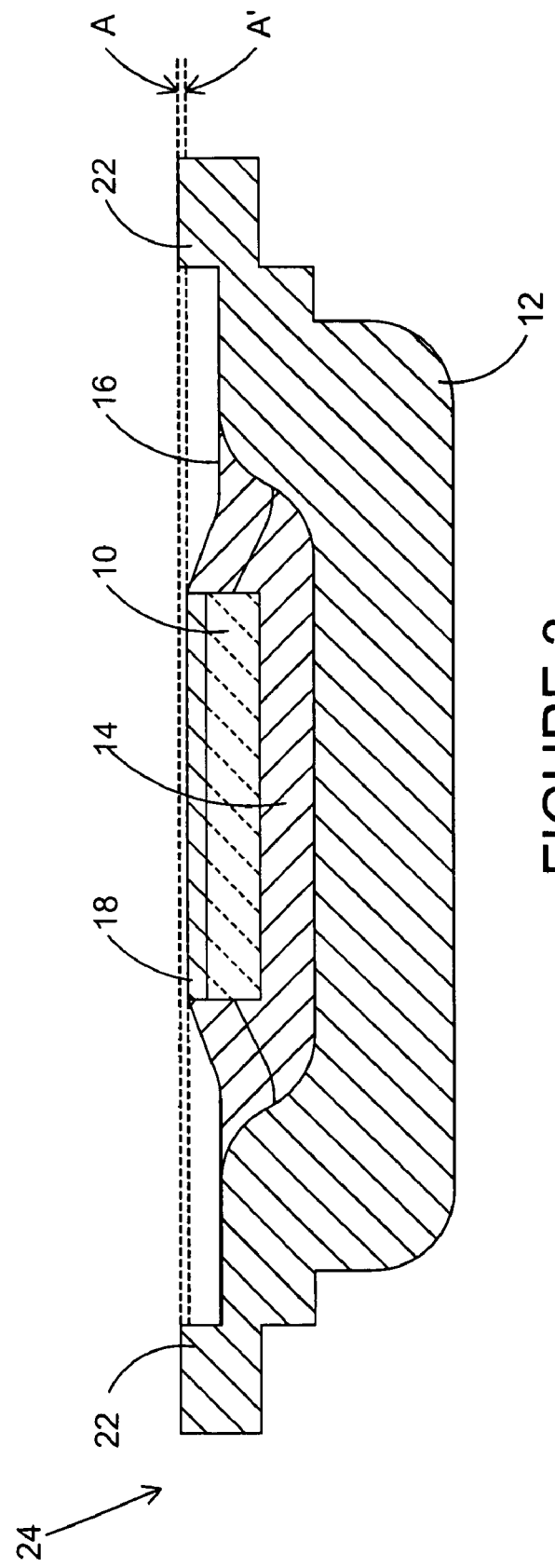
FIG. 3 shows a cross-section of a semiconductor package of FIGS. 1 and 2 modified according to the present invention.

Referring now to FIG. 3, in accordance with the present invention, semiconductor package 24 includes MOSFET 10 that is set back deeper into the interior of can 12 than in prior art packages as shown in FIG. 1 and FIG. 2. Therefore, source contact 18 and gate contact 20 (not shown in FIG. 3) of MOSFET 10 are no longer flush with projections 22 of can 12. This arrangement is illustrated in FIG. 3 by the gap between broken lines A, A'. It has been found that when MOSFET 10 is set deeper within can 12 such that source 18 is offset from the plane of the circuit board (as represented by broken line A) by about 0.001-0.005 inches failure due to thermal cycling of the part when soldered down or affixed by an epoxy to a substrate is reduced.

In other words, a semiconductor package according to the present invention includes a metal can which receives in its interior space a MOSFET or other similar semiconductor type device die. The MOSFET so received is inwardly recessed in the can and oriented such that the MOSFET's drain electrode is facing the bottom of the can and is electrically connected to the same by a layer of conductive epoxy or a solder or the like. The edges of the MOSFET so placed are spaced from the walls of the can. The space between the edges of the MOSFET and the walls of the can is filled with an insulating layer. The can preferably includes two rows of posts on its opposing edges. The posts are connectable to appropriate conduction pads on a substrate, such as a circuit board, to connect the drain of the MOSFET to its appropriate place within a circuit. Moreover, in an alternative embodiment of the present invention, the posts can be a full or partial portion of the rim of the can.

As a result of this arrangement, the source and gate electrodes of the MOSFET face the substrate when the can is mounted thereon. It has been found that if the MOSFET is positioned within the can so that the source and gate electrodes of the MOSFET become sub-flush with the surface of the substrate, failure due to thermal cycling is improved. Thus, according to an aspect of the present invention, the bottom surface of the MOSFET is sub-flush below the plane of the substrate by 0.001-0.005 inches to reduce temperature cycling failures. The sub-flush volume is filled by the conductive attachment material such as solder, epoxy, and the like.

Variations of the disclosed invention are possible without diversion from its scope and spirit. It would thus be recognized by a skilled person in the art that materials other than the ones described with reference to the preferred embodiment of the invention may be used to accomplish the intended advantageous results of the present invention. For example, instead of MOSFET 10, an IGBT, a thyristor, a diode or any other suitable semiconductor device may be used in the package according to the invention. As further examples, other alloys may be used to form the can 12 and/or other conductive means other than silver-loaded epoxy 14 may be used to connect the semiconductor die to the can 12.

Thus, although the present invention has been described in relation to particular embodiments thereof, many other variations and modifications and other uses will become apparent to those skilled in the art. It is preferred, therefore, that the present invention be limited not by the specific disclosure herein, but only by the appended claims.

What is claimed is:

1. A semiconductor package comprising:
   a can including a connection surface for external connection, said connection surface terminating at a first plane;
   a semiconductor die disposed in the interior of the can, said semiconductor die including one electrode electrically connected to an interior surface of said can and another opposing electrode terminating at a second plane;
   wherein said first plane and said second plane are spaced to define a volume that is fillable by a conductive attachment material, and
   wherein said first plane and said second plane are spaced 0.001 to 0.005 inches.

2. A semiconductor package according to claim 1, wherein said first plane represents the plane of a circuit board.

3. A semiconductor package according to claim 1, wherein said can is formed of a copper alloy.

4. A semiconductor package according to claim 3, wherein said can is silver plated.

5. A semiconductor package according to claim 1, wherein said conductive attachment material is either solder or an epoxy.

6. A semiconductor package according to claim 1, further comprising a space between the interior surface of said can and said die, an insulation body residing in said space.

7. A semiconductor package according to claim 1, wherein said semiconductor die is a power MOSFET.

8. A semiconductor package according to claim 1, wherein said semiconductor die is an IGBT.

9. A semiconductor package according to claim 1, wherein said semiconductor die is a diode.

10. A semiconductor package according to claim 1, wherein said can is cup-shaped and includes a peripheral rim portion surrounding said semiconductor die.

11. A semiconductor package according to claim 1, wherein said can includes at least two opposing rows of posts each connectable to conductive pads on a substrate.

12. A semiconductor package according to claim 1, wherein said can includes a rim at least a partial portion of which serves as a post.

13. A semiconductor package according to claim 1, wherein said semiconductor die is a power MOSFET having a drain electrode electrically connected to an interior surface of said can and a source electrode terminating at said second plane.

14. A semiconductor package comprising:
   a silver-plated copper alloy can including a connection surface for external connection, said connection surface terminating at a connection plane;
   a semiconductor die disposed in the interior of said can, said semiconductor die including one electrode electrically connected to an interior surface of said can and another opposing electrode recessed from said connection plane;
   wherein said connection plane and said opposing electrode are spaced to define a distance between said opposing electrode and a substrate when said connection surface is connected to said substrate.

15. A semiconductor package according to claim 14, wherein said space between said substrate and said opposing electrode is fillable with a conductive attachment material.

16. A semiconductor package according to claim 15, wherein said conductive attachment material is either solder or an epoxy.

17. A semiconductor package according to claim 14, wherein said opposing electrode and said substrate are spaced 0.001-0.005 inches.

18. A semiconductor package according to claim 14, further comprising a space between the interior surface of said can and said die, an insulation body residing in said space.

19. A semiconductor package according to claim 14, wherein said semiconductor die is a power MOSFET.

20. A semiconductor package according to claim 14, wherein said semiconductor die is an IGBT.

21. A semiconductor package according to claim 14, wherein said semiconductor die is a diode.

22. A semiconductor package according to claim 14, wherein said can is cup-shaped and includes a peripheral rim portion surrounding said semiconductor die.

23. A semiconductor package according to claim 14, wherein said can includes at least two opposing rows of posts each connectable to conductive pads on a substrate.

24. A semiconductor package according to claim 14, wherein said can includes a rim at least a partial portion of which serves as a post.

25. A semiconductor package according to claim 14, wherein said semiconductor die is a power MOSFET having a drain electrode electrically connected to an interior surface of said can and a source electrode terminating at said second plane.

* * * * *